United States Patent
Sato et al.

(10) Patent No.: US 6,352,628 B2
(45) Date of Patent: Mar. 5, 2002

(54) REFRACTORY METAL SILICIDE TARGET, METHOD OF MANUFACTURING THE TARGET, REFRACTORY METAL SILICIDE THIN FILM, AND SEMICONDUCTOR DEVICE

(75) Inventors: Michio Sato, Yokohama; Takashi Yamanobe, Yamato; Tohru Komatsu, Yokosuka; Yoshiharu Fukasawa, Yokohama; Noriaki Yagi, Yokohama; Toshihiro Maki, Yokohama; Hiromi Shizu, Fujisawa, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/846,370

(22) Filed: May 2, 2001

Related U.S. Application Data

(63) Continuation of application No. 08/397,243, filed as application No. PCT/JP94/01236 on Jul. 27, 1994, now Pat. No. 6,309,593.

(30) Foreign Application Priority Data

Jul. 27, 1993 (JP) .............................................. 5-203707

(51) Int. Cl.[7] ........................ C23C 14/34; H01R 13/73; H01R 9/22
(52) U.S. Cl. ................................. 204/298.13; 439/894
(58) Field of Search ...................... 204/298.13; 439/894

(56) References Cited

U.S. PATENT DOCUMENTS

| | | | |
|---|---|---|---|
| 4,750,932 A | 6/1988 | Parent et al. | 204/298.13 |
| 4,803,046 A | 2/1989 | Hausselt et al. | 204/298.13 |
| 4,938,798 A * | 7/1990 | Shiba et al. | 75/230 |
| 5,294,321 A | 3/1994 | Saton et al. | 204/298.13 |
| 5,418,071 A | 5/1995 | Saton et al. | 204/298.13 |
| 5,447,616 A * | 9/1995 | Satou et al. | 204/298.13 |
| 5,460,793 A | 10/1995 | Kano et al. | 204/298.12 |
| 5,464,520 A | 11/1995 | Kano et al. | 204/298.12 |
| 5,733,427 A * | 3/1998 | Satou et al. | 204/298.13 |

FOREIGN PATENT DOCUMENTS

EP 0 55 085 8/1993 ............ C08G/73/16

OTHER PUBLICATIONS

Patent Abstract No. JP 64–39374, Feb. 9, 1989.*
Patent Abstract No. JP 2–47261, Feb. 16, 1990.
Patent Abstract No. JP 63–219580, Sep. 13, 1988.
Patent Abstract No. JP 62–171911, Jul. 28, 1987.

* cited by examiner

Primary Examiner—Nam Nguyen
Assistant Examiner—Steven H. VerSteeg
(74) Attorney, Agent, or Firm—Oblon, Spivak, McClelland, Maier & Neustadt, P.C.

(57) ABSTRACT

A refractory metal silicide target is characterized by comprising a fine mixed structure composed of $MSi_2$ (where M: refractory metal) grains and Si grains, wherein the number of $MSi_2$ grains independently existing in a cross section of 0.01 mm² of the mixed structure is not greater than 15, the $MSi_2$ grains have an average grain size not greater than 10 μm, whereas free Si grains existing in gaps of the $MSi_2$ grains have a maximum grain size not greater than 20 μm. The target has a high density, high purity fine mixed structure with a uniform composition and contains a small amount of impurities such as oxygen etc. The employment of the target can reduce particles produced in sputtering, the change of a film resistance in a wafer and the impurities in a film and improve yield and reliability when semiconductors are manufactured.

5 Claims, 7 Drawing Sheets

COMPARATIVE EXAMPLE 1   10 μm   (MAGNIFICATION RATIO X 1000)

COMPARATIVE EXAMPLE 1   10 μm   (MAGNIFICATION RATIO X 1000)

REFRACTORY METAL SILICIDE TARGET, METHOD OF MANUFACTURING THE TARGET, REFRACTORY METAL SILICIDE THIN FILM, AND SEMICONDUCTOR DEVICE

This application is a continuation of application Ser. No. 08/397,243 filed on Mar. 20, 1995, now U.S. Pat. No. 6,309,593 B1 which was originally filed as PCT/JP94/01236 on Jul. 27, 1994.

TECHNICAL FIELD

The present invention relates to a refractory metal silicide target, a method of manufacturing the target, a refractory metal silicide thin film, and a semiconductor device, and more specifically, to a refractory metal silicide target, a method of simply manufacturing the target, a refractory metal silicide thin film, and a semiconductor device capable of reducing the generation of particles in sputtering and forming a thin film of high quality by densifying or fining a mixed structure and making a uniform composition and further achieving high density and high purification.

BACKGROUND ART

A sputtering method is employed as one of the effective methods of forming a refractory metal silicide thin film used for a gate electrode, source electrode, drain electrode of semiconductor devices such as MOS, LSI devices and the like and for wiring. The sputtering method, which is excellent in mass-productivity and the stability of a formed film, is a method such that argon ions are caused to collide with a disc-shaped refractory metal silicide target and discharge a target constituting metal which is deposited as a thin film on a substrate disposed in confrontation with the target. Consequently, the property of the silicide thin film formed by sputtering greatly depends upon the characteristics of the target.

Recently, as a semiconductor device is highly integrated and miniaturized, it is required that a sputtering target used to form a refractory metal silicide thin film produces a less amount of particles (fine grains). That is, since particles produced from a target during sputtering have a very fine grain size of about 0.1–10 $\mu$m, when the particles are mixed into a thin film being deposited, they cause a serious problem that the yield of semiconductor devices is greatly reduced by the occurrence of short circuit between wires of a circuit and insufficient opening of wires. Thus, the reduction of an amount of particles is strongly required.

Since it can become effective means to miniaturize a target structure, that is, to make the size of $MSi_2$ grains and free Si grains as small as possible in order to reduce an amount of particles produced from a target, there are conventionally proposed various manufacturing methods of miniaturizing the structure.

For example, Japanese Patent Application Laid-Open No. Sho 63(1988)-219580 discloses that a high density target having a fine structure and containing a small amount of oxygen can be obtained in such a manner that a mixed powder obtained by mixing a high purity refractory metal powder with a high purity silicon powder is subjected to a silicide reaction in high vacuum and a semi-sintered body is formed, then the resultant semi-sintered body is charged into a pressure-tight sealing canister without being crushed and the pressure-tight sealing canister is sintered by a hot isostatic press after having evacuated and sealed. In this case, the thus obtained target has a fine structure having the maximum grain size of $MSi_2$ not greater than 20 $\mu$m and the maximum grain size of free Si not greater than 50 $\mu$m and containing oxygen not greater than 200 ppm with a density ratio not less than 99%.

Further, Japanese Patent Application Laid-Open No. Hei 2(1990)-47261 discloses that a high density target with a fine structure can be obtained in such a manner that a mixed powder of a high purity refractory metal powder and a high purity silicon powder is subjected to a silicide reaction in high vacuum and a semi-sintered body is formed, then the semi-sintered body is crushed to not greater than 150 $\mu$m and further added and mixed with a high purity silicon powder and charged into a pressure-tight sealing canister, then the pressure-tight sealing canister is sintered by a hot isostatic press after having evacuated and sealed. In this case, the thus obtained target has a maximum grain size of $MSi_2$ not greater than 20 $\mu$m and a density ratio not less than 99% with only free Si existing in a grain boundary.

Recently, as a semiconductor device is highly integrated and miniaturized, a high purity target containing a very small amount of impurities, which deteriorate the characteristics of the semiconductor device, is required as a sputtering target used to form a refractory metal silicide thin film. In particular, it is strongly required to minimize an amount of oxygen in a target because oxygen, which concentrates on the interface between a silicide layer and an under layer and increases a film resistance, delays signals and lowers the reliability of the device.

Since it is effective oxygen reducing means to make deoxidation by heating a semi-sintered body as a material in vacuum and volatilizing oxygen in the form of silicon oxide (SiO or $SiO_2$), the following manufacturing methods of reducing oxygen are conventionally proposed.

For example, Japanese Patent Application Laid-Open No. Sho 62(1987)-171911 obtains Mo silicide or W silicide each containing a small amount of oxygen in such a manner that a mixed powder obtained by mixing a Mo powder or W powder with a Si powder is heated in vacuum at a temperature less than 800–1300° C. and a Mo silicide powder or W silicide powder is synthesized, then the resultant powder is held in vacuum at 1300–1500° C. to remove oxygen as SiO by excessive Si.

On the other hand, a trial for optimizing the grain size of a material powder and hot pressing conditions from a view point that the condensation of free Si results to an increase of particles produced and the following manufacturing method is proposed.

For example, Japanese Patent Application Laid-Open No. Sho 63(1988)-74967 obtains a target from which condensed silicon is removed in such a manner that a mixed powder obtained by adding a synthesized silicide powder of –100 mesh with a silicon powder of –42 mesh is heated to 1300–1400° C. while applying a preload of 60–170 kg/cm$^2$, then pressed with a pressing pressure of 200–400 kg/cm$^2$ and held after being pressed.

Further, Japanese Patent Application Laid-Open No. Sho 64(1989)-39374 obtains a target from which condensed silicon is removed in such a manner that two types of synthesized silicide powders of –100 mesh having a different composition are prepared and a mixed powder adjusted to have an intended composition is hot pressed under the same conditions as above.

There is a problem, however, that when all the amounts of a mixed powder necessary to form a single target is subjected to a silicide synthesis at once in high vacuum in the above conventional manufacturing methods, resulting $MSi_2$ grains are rapidly grown and coarsened as well as cracks are made to an entire semi-sintered body by a rapidly increased temperature in a silicide reaction because the silicide reaction is an exothermic reaction, and when the semi-sintered body is sintered by pressing in the state as it is, a resultant sintered body cannot be used because the cracks remain.

There is also a problem that since a mixed material powder overflows from a vessel by the rapid increase of temperature in the silicide reaction and a composition is out of an intended composition due to the volatilization of very volatile Si. Thus, when the semi-sintered body is sintered by pressing in the state as it is, a target having a desired composition cannot be obtained.

Further, there is a problem that even if a semi-sintered body is crushed and made to a powder, since hard $MSi_2$ particles which have been grown once and coarsened remain without being finely crushed, a target having a uniform and fine structure cannot be obtained as well as an amount of contamination caused by impurities is increased by crushing and in particular an amount of oxygen is greatly increased.

On the other hand, as disclosed in Japanese Patent Application Laid-Open No. Sho 62(1987)-171911, when a mixed powder is subjected to a silicide synthesization at 800–1300° C. and further deoxidized by being heated to high temperature so as to reduce impurity oxygen, there is a problem that since the sintering property of a resultant semi-sintered body is excessively improved, the semi-sintered body cannot be sufficiently crushed in a subsequent crushing process and formed to a segregated structure in which $MSi_2$ and Si are irregularly dispersed, and in particular, when a heating temperature reaches a temperature region exceeding 1400° C., this tendency is made more remarkable.

Although a semi-sintered body is crushed in an atmosphere replaced with Ar (argon gas) to prevent an increase of an oxygen content, it is difficult to completely prevent the contamination by oxygen when the semi-sintered body is crushed. Further, a problem also arises in that when a crushed powder is taken out from a vessel such as a ball mill or the like, the powder surely adsorbs oxygen to increase oxygen contained therein, and as a result a finely crushed powder has an increased surface area and an amount of oxygen adsorbed by the powder is greatly increased.

On the other hand, even if a synthesized powder was hot pressed while applying a preload of 60–170 kg/cm$^2$ thereto according to the methods of Japanese Patent Application Laid-Open No. Sho 63(1988)-74967 and Japanese Patent Application Laid-Open No. Sho 64(1989)-39374, condensed silicon was disadvantageously produced and a target having a fine and uniform structure could not be obtained.

Further, when a synthesized powder was hot pressed without being applied with a preload, $MSi_2$ grains obtained by synthesization was grown as well as a composition has an inclined distribution in a target and it was difficult to obtain a target having a fine and uniform structure.

Japanese Patent Application Laid-Open No. Sho 62(1987)-70270 discloses a refractory metal silicide target having a density ratio not less than 97%. Further, Japanese Patent Application Laid-Open No. Sho 62(1987)-230676 discloses a methods of manufacturing a refractory metal silicide target and describes that a target is molded by compacting using a single axis under the conditions of high temperature, high vacuum and high pressing pressure.

However, the above respective prior arts describe only that a target is made by subjecting a material powder for the target to hot pressing and no description is made as to a fine and uniform structure. Thus, these prior arts cannot achieve an object for effectively suppressing particles.

On the other hand, International Patent Application published according to PCT (No. WO91/18125 discloses a silicide target having 400×10$^4$ pieces of silicide with a grain size of 0.5–30 μm existing in a cross section of the mixed structure of the target of 1 mm$^2$ with the maximum grain size of Si not greater than 30 μm and further a silicide target with the average grain size of silicide of 2–15 μm and the average grain size of Si of 2–10 μm.

Since the manufacturing method described in the prior art is insufficient to obtain a fine uniform target structure, the object to suppress the occurrence of particles cannot be sufficiently achieved.

An object of the present invention is to provide a high density and purity refractory metal silicide target which has a fine mixed structure and a uniform composition as well as contains a less amount of impurities such as oxygen and the like, a method of manufacturing the target, a refractory metal silicide thin film and a semiconductor device.

DISCLOSURE OF THE INVENTION

As a result of a zealous study why particles are generated, the inventors of this invention have obtained the following knowledge for the first time:

(1) since free Si has a sputtering rate larger than that of $MSi_2$, as sputtering proceeds, $MSi_2$ is exposed on an erosion surface and $MSi_2$ grains having a weak bonding force with adjacent grains are liable to be removed from the erosion surface, and in particular very fine $MSi_2$ grains remarkably exhibit this tendency;

(2) although the form of erosion in a free Si portion exhibits a wave-shape, as the Si portion increases, the distal end of the wave-shape is made acute and further the height of the wave-shape increases, thus the distal end of Si is dropped off or lacked by the thermal fluctuation in sputtering so that Si is liable to become particles; and (3) when pores remain in the interface between $MSi_2$ and free Si of a target or in the interior of free Si, projections are formed around the pores, and abnormal electric discharge occurs in the portion where the projections exist in sputtering, by which the projections are dropped or lacked and made to particles, and the like.

Further, the inventors have found it is very effective to suppress the generation of the particles that:

(1) a fine mixed structure is formed such that the number of $MSi_2$ grains (M: refractory metal) which independently exist on any arbitrary surface or in a cross section of 0.01 mm$^2$ of the mixed structure is not greater than 15, $MSi_2$ has an average grain size not greater than 10 μm and free Si existing in the gaps of $MSi_2$ has a maximum grain size not greater than 20 μm;

(2) the mixed structure is arranged such that a Si/M atom ratio X in 1 mm$^2$ of the mixed structure has a dispersion of X±0.02 and free Si is uniformly dispersed; and (3) a density ratio is not less than 99.5% over the entire surface of a target, and the like.

Further, the inventors have found that the growth of $MSi_2$ grains produced can be suppressed and a large dislocation (dispersion of a composition ratio) of a composition can be prevented without volatilizing almost all the Si in such a manner that when silicide is synthesized once in a silicide synthesizing process, mixed powders each divided to a small amount of lot are charged into a compacting mold, that is, a depth of the compacting mold to which the mixed powders are charged is set to not deeper than 20 mm and the mixed powders are heated in vacuum and synthesized.

Further, to reduce impurities in a target and increase its purity, the inventors have found that:

(1) a refractory metal silicide semi-sintered body containing a less amount of oxygen not greater than 200 ppm which cannot be obtained by prior art can be obtained in such a manner that a semi-sintered body obtained by synthesizing silicide is crushed once and a resultant crushed powder is deoxidized by being heated in vacuum or in a pressure-reduced hydrogen atmosphere in stead of deoxidizing the semi-sintered body by heating it in the state as it is;

(2) when a plurality of powder charging vessels each having the same inside diameter are prepared and crushed powders are deoxidized so that semi-sintered bodies can be sintered in a shape as they are by a hot isostatic press method or the like, since the semi-sintered bodies have the same shape, a plurality of semi-sintered bodies can be sintered at the same time and there is an advantage that the productivity of targets can be improved;

(3) when the silicide synthesis is performed in a vacuum furnace using a graphite heater and insulator, a semi-sintered body obtained by the synthesization is mixed with carbon and iron and contaminated by them. In contrast, when the silicide synthesis is performed in a vacuum furnace using a heater and an insulator each composed of a high purity refractory material, the contamination can be effectively prevented; and (4) contamination caused by impurities contained in a material can be effectively prevented by crushing a semi-sintered body in a ball mill having a ball mill main body the inside of which is lined with a high purity material and crushing mediums (balls) formed of a high purity material, and the like.

Further, as a result of a zealous study of hot pressing conditions effected by using a synthesized powder, the inventors have found that the size of $MSi_2$ grains produced is different depending upon a temperature for applying a pressing pressure and how the temperature is increased and that the composition in a target has an inclined distribution in accordance with the temperature and pressure conditions. More specifically, the inventors have found that when a synthesized powder is heated up to just below an eutectic temperature and then applied with a pressing pressure, $MSi_2$ grains formed by synthesization are regrown and that free Si flows in the direction of the end of a target and its composition has an inclined irregular distribution as the $MSi_2$ grains grow.

Further, the inventors have obtained the knowledge that when a certain degree of a pressing pressure is applied at a temperature step less than 1200° C. and then heating is effected stepwise or at a low rate up to just below an eutectic temperature and further a larger pressing pressure is applied, the growth of $MSi_2$ grains is effectively prevented, the composition in a target is made uniform and a density of the target is increased for the first time.

The present invention has been completed based on the above knowledges.

More specifically, a refractory metal silicide target according to the present invention is characterized by comprising a fine mixed structure composed of $MSi_2$ (where M: refractory metal) grains and Si grains, wherein the number of $MSi_2$ grains independently existing in a cross section of 0.01 mm² of the mixed structure is not greater than 15, the $MSi_2$ grains has an average grain size not greater than 10 µm, whereas free Si grains existing in the gaps of the $MSi_2$ grains have a maximum grain size not greater than 20 µm.

Specifically, W, Mo, Ti, Ta, Zr, Hf, Nb, V, Co, Cr, Ni are used as the metal (M) constituting the above metal silicide ($MSi_2$).

Note, the shape and the number of $MSi_2$ grains and Si grains in the above mixed structure are measured as follows. That is, the maximum grain size, average grain size and number of $MSi_2$ grains are measured in such a manner that a photograph showing the structure of a target sintered body is obtained by photographing a fracture surface of the sintered body under a scanning type electron microscope (SEM) at a magnification ratio of 1000 and thus obtained photograph is then analyzed with an image analyzer. A visual field to be image-analyzed must cover 10 points.

On the other hand, the maximum grain size, average grain size and number of free Si grains and chain-shaped (link-formed) Si grains are measured in such a manner that a photograph showing the structure of a target sintered body is obtained by photographing a polished surface of the sintered body under a scanning type electron microscope (SEM) at a magnification ratio of 1000, then the photograph is analyzed with an image analyzer. In that case, 5 cross sections obtained by equally dividing the polished surface in the thickness direction thereof at a pitch of 10 µm were measured and when Si grains are freed from other Si grains, they are regarded as free Si, whereas when Si grains are coupled with other Si grains at any portion thereof, they are regarded as chain-shaped Si. A visual field must cover 20 points in each cross section.

Since Si is more deeply eroded than $MSi_2$ by sputtering in the above mixed structure, preferable is a structure arranged such that $MSi_2$ grains are coupled each other like a chain and Si grains exist in the gaps of the $MSi_2$ grains to reduce particles generated in a target because $MSi_2$ grains are liable to be removed or dropped from an eroded surface in a portion where $MSi_2$ independently exists in Si phase.

When the size of $MSi_2$ grains is increased, Si is selectively scattered from $MSi_2$ and forms projections like grains. Since these projections are released and made to particles, the average grain size of $MSi_2$ is preferably not greater then 10 µm and more preferably not greater than 5 µm to prevent the occurrence of the projections. On the other hand, Si is eroded to a wave-shape by sputtering, and as the size of Si is increased, the wave-shape is made acute and deep and Si is liable to be lacked or dropped off. Thus, the maximum grain size of Si is preferably not greater than 20 µm, more preferably not greater than 15 µm, and further more preferably not greater than 10 µm.

When the average value of a Si/M atom ratio in an entire target is assumed to be X, it is preferable that the dispersion of the Si/M atom ratio in an arbitrary cross section of 1 mm² in the mixed structure is preferably set within the range of X±0.02. That is, when $MSi_2$ and Si irregularly disperse even if a target has a fine structure, in particular when free Si is locally concentrated and irregularly distributed, since the structure in the target is greatly changed as well as a plasma electric discharge is unstably carried out and particles are induced, the dispersion of the Si/M atom ratio X in an area of 1 mm² is preferably X±0.02 and more preferably X±0.01.

It is preferable to form a high density silicide target in which the density ratio of a target is not less than 99.5% over the entire target. When there remain many pores (holes) due to an insufficient density of a target, the pores exist in an interface between $MSi_2$ and Si or in the interior of Si, projections are formed around the pores in sputtering, an abnormal electric discharge is caused in the portion of the projections and the projections are broken and released by the discharge, which results in the occurrence of particles.

Thus, the pores must be reduced as few as possible, and for this purpose, the density ratio of target is preferably not less than 99.5%, more preferably not less than 99.7% and further more preferably not less than 99.8% over the entire target.

It is preferable that a content of oxygen as an impurity is set to not greater than 200 ppm and a content of carbon as an impurity is set to not greater than 50 ppm. When oxygen is taken into a deposited thin film by sputtering a target containing oxygen, silicon oxide is formed in the interface of the thin film and a resistance of the film is increased by the silicon oxide. Thus, to further reduce the resistance of the film, an oxygen content in target is preferably set to not greater than 200 ppm and more preferably not greater than 100 ppm. Further, since carbon also increases a resistance of the film by forming silicon carbide, a carbon content in target is preferably set to not greater than 50 ppm and more preferably not greater than 30 ppm to reduce the resistance of the film.

The contents of iron and aluminium as impurities are set to not greater than 1 ppm, respectively. When iron and aluminium are mixed into a deposited thin film, a deep level is formed in the interface of the thin film and causes a leakage in connection, by which a semiconductor is poorly operated and its characteristics are deteriorated. Thus, an iron content and aluminium content in target are preferably set to not greater than 1 ppm, respectively and more preferably not greater than 0.5 ppm, respectively.

Next, a method of manufacturing a refractory metal silicide target according to the present invention will be described below.

In a process I (step I), a refractory metal powder having a maximum grain size not greater than 15 $\mu$m is blended with a silicon powder having a maximum grain size not greater than 30 $\mu$m such that a Si/M atom ratio (value X in $MSi_x$) is 2–4 and these powders are sufficiently mixed each other in a dry state using a ball mill, V-type mixer or the like so that the silicon powder uniformly disperses in the refractory metal powder. The irregularly mixing of them is not preferable because the structure and composition of a target is made irregular and characteristics of the film formed by using the target are deteriorated. The powders are preferably mixed in a vacuum of not higher than $1\times10^{-3}$ Torr or in an inert gas atmosphere such as an argon gas to prevent contamination by oxygen. In particular, when a pulverizer or powder crushing mixer such as a ball mill or the like is used, contamination by impurities can be effectively prevented by performing mixing operation in a dry state using a ball mill having a main body the inside of which is lined with a high purity material not less than 5N (99.999%) and crushing mediums (balls) composed of a high purity material so that contamination caused by impurities from a crusher main body can be prevented.

The same material as the refractory metal (M) constituting a target is preferably used as the above high purity material and, for example, W, Mo, Ti, Ta, Zr, Hf, Nb, V, Co, Cr, Ni etc. are used.

As a method of lining the pulverizer main body with the high purity material, there can be employed a method of lining a high purity material sheet, a method of integrally forming a high purity material layer on the inner surface of a main body by various depositing methods such as CVD, plasma vapor deposition, and the like.

The refractory metal powder and silicon powder used as a target material preferably contain impurities, which deteriorate characteristics of a semiconductor device, in an amount as small as possible and preferably have a purity not lower than 5N (99.999%). Further, since coarse powders coarsen formed $MSi_2$ grains and si grains and lowers the dispersing property of Si, the refractory metal powder preferably has a gain size not greater than 15 $\mu$m and the silicon powder preferably has a grain size not greater than 30 $\mu$m. Further, the refractory metal powder preferably has a grain size not greater than 10 $\mu$m and the silicon powder preferably has a grain size not greater than 20 $\mu$m. Furthermore, the refractory metal powder preferably has a gain size not greater than 5 $\mu$m and the silicon powder preferably has a grain size not greater than 10 $\mu$m.

A reason why the value X of the Si/M atom ratio is limited to $2 \leq X \leq 4$ is as described below. That is, when the value X is less than 2, free Si reduces and further disappear in a silicide target and the structure defined by the present invention cannot be obtained. On the other hand, when the value X exceeds 4, since free Si continuously exists, there is obtained a structure in which $MSi_2$ grains exist in a Si matrix. Consequently, the structure of the present invention that $MSi_2$ grains are coupled each other like a chain and Si grains exist in the gaps of the $MSi_2$ grains is difficult to be obtained. Further, when the value X is less than 2, since a large tensile strength is produced in a formed silicide film, the close contact property of the film with a substrate is deteriorated and the film is liable to be exfoliated or peeled from the substrate. On the other hand, when the value X exceeds 4, since a film resistance increases, a resultant film is improper as an electrode wiring film. Further, when a mixed powder having the value X not less than 2 is synthesized to silicide, since free Si exists, there is an advantage that a crushing property is improved in a process III to be described below.

Si is preferably blended in an amount which is a little in excess of the amount of an intended composition by taking an loss caused by the volatilization of a Si and $SiO_2$ film covering the surface of Si powders into account.

A process II is a process for synthesizing refractory metal silicide as well as forming a semi-sintered body by charging the mixed powder prepared in the process I into a compacting mold and heating the powder in high vacuum or in an inert gas atmosphere. In the process II, since an amount of the mixed powder to be charged into the compacting mold and subjected to a synthesizing operation effected once affects the size of $MSi_2$ grains to be produced and an amount of Si to be volatilized, it is preferable to set an amount of the mixed powder charged once to a depth not higher than 20 mm. When the depth of charge exceeds 20 mm, formed $MSi_2$ grains are coarsened due to a temperature increase caused by a silicide reaction and the powder may be caused to overflow from the vessel by an explosive reaction. On the other hand, when the mixed powder to be charged into the vessel has a depth not higher than 1 mm, the number of vessels used for a single target is greatly increased as well as an amount of production per a synthesizing treatment is greatly reduced, and productivity is lowered. Thus, a preferable depth of charge is 1–10 mm. When Mo is used as a refractory metal powder, however, an amount of the mixed powder to be charged into a vessel is preferably set to a depth not higher than 10 mm and more preferably a depth not higher than 5 mm because a particularly high calorific value is generated by a silicide reaction.

A vessel used here is preferably composed of a high purity Mo, W, Ta, Nb material or the like to prevent the contamination of the mixed powder caused by impurities generated from the vessel and thermal deformation. Further, it is preferable to use the same metal material as a refractory metal (M) constituting intended refractory metal silicide. Further, the flat portion of the vessel may be set to such a shape and size as to enable the vessel to be inserted into calcining equipment such as sintering furnace.

As a heating pattern, it is preferable to effect heating stepwise from a temperature 200° C. lower than a silicide reaction start temperature to suppress the growth of $MSi_2$ grains and minimize the change of a composition. A temperature increasing width is preferably 20–200° C. That is, when the temperature increasing width is less than 20° C., a long time is needed to synthesization and productivity is lowered, whereas the width exceeds 200° C. $MSi_2$ grains are grown and the powder is caused to overflow from the vessel by an abrupt increase of temperature, and a composition is changed and the interior of the furnace is contaminated. Further, each temperature is preferably held for 0.1–3 hours. When the holding time is less than 0.1 hour, the temperature of the powder in the vessel is not made uniform and a temperature difference abruptly increases, and $MSi_2$ grains are coarsened. On the other hand, when the holding time exceeds 3 hours, a long time is needed for synthesization and productivity is lowered. Note, the temperature increasing width is preferably set to 20–200° C. and more preferably to 50–100° C. and the holding time is more preferably set to the range of 0.5–2 hours. In particular, when the temperature is increased to a temperature of 100° C. or more higher than the silicide reaction start temperature, it is preferable to set a long holding time at the silicide reaction start temperature or within the start temperature +50° C. and the holding time is preferably not shorter than 1 hour. The silicide reaction start temperature can be determined by detecting when a degree of vacuum in the furnace is lowered by the volatilization of Si or silicon oxide (SiO or $SiO_2$) caused by a reaction heat.

Further, the same effect can be achieved by carrying out heating operation slowly in place of the stepwise heating. In this case, a heating rate is preferably controlled to 5° C./minute or less. When the heating rate is excessively large, $MSi_2$ grains are grown as well as the powder is caused to overflow from the vessel, the composition is changed and the interior of a furnace is contaminated by the abrupt increase of the temperature.

A maximum heating temperature in synthesization is preferably increased up to 1100° C. so that a silicide reaction starts and synthesization is completed. Since a reaction temperature is different depending upon an amount of oxygen contained in the mixed powder, however, the maximum heating temperature is preferably increased to about 1300° C. by taking the reduction of the oxygen content into consideration. When the temperature is increased to higher than 1300° C., the sintering of a semi-sintered body formed by a silicide reaction proceeds and its crushing in a process III is made difficult and further free Si is melted as well as $MSi_2$ grains are grown and coarsened by an eutectic reaction. Thus, there is obtained a structure in which $MSi_2$ grains and Si grains irregularly disperse and as a result a silicide target having an intended crystal structure cannot be obtained. On the other hand, when the maximum heating temperature is not higher than 1000° C., the silicide reaction does not start and synthesization is made impossible except the case that M is Ni. Thus, a more preferable temperature range is 1150–1250° C.

Note, when the above maximum heating temperature is excessively high in the case M is Ni, sintering is liable to proceed as compared with the case M is other than Ni. Thus, the temperature is preferably increased up to about 800° C. and more preferably in the range of 700–800° C. only when Ni is used.

When a refractory metal silicide is synthesized as well as a semi-sintered body is formed in the process II, a vacuum furnace employed for heating is preferably, for example, a vacuum furnace using a high purity Mo heater or a high purity W heater and an insulator composed of a high purity refractory material, by which a semi-sintered body obtained by synthesization can be effectively protected from contamination caused by impurities from the heater and insulator.

In a process III, a refractory metal silicide semi-sintered body which is obtained by synthesizing silicide and has an atom ratio X of $2 \leq X \leq 4$, is crushed or pulverized and a crushed powder is prepared. A powder lump in which free Si segregated to an aggregation of $MSi_2$ formed in synthesization exists is finely crushed and uniformly dispersed by the crushing process. When this dispersing operation is no effected uniformly, since the dispersion of $MSi_2$ and free Si is lowered, the structure and composition of a target are not uniformly arranged and a film characteristics are deteriorated, a crushing time is preferably not shorter than 24 hours. On the other hand, although the longer the crushing time, the more improved is a crushing efficiency, since productivity is lowered and an amount of contamination is increased by oxygen, the crushing time is preferably not longer than 72 hours. The maximum grain size of a powder obtained by the crashing is an important factor for obtaining a fine uniform structure defined by the present invention. Therefore, the maximum grain size is preferably not greater than 20 $\mu$m and more preferably not greater than 15 $\mu$m in order to obtain the structure defined by the present invention that $MSi_2$ grains have an average grain size not greater than 10 m and free Si grains have a maximum grain size not greater than 20 $\mu$m.

The crushing is preferably effected in vacuum or in an inert gas atmosphere similarly to the process I to prevent the contamination by oxygen. In particular, when a crushing mixer such as a ball mill or the like is used, contamination by impurities can be effectively prevented by carrying out mixing operation in a dry state using a ball mill having a main body the inside of which is lined with a high purity material and crushing mediums (balls) composed of a high purity material so that contamination caused by impurities from the crusher main body can be prevented.

Further, it is preferable that the following impurity removing process is followed by the process III to remove impurities contained in the crushed power such as oxygen, carbon etc. That is, the impurity removing process is a process for heating the crushed powder prepared in the process III and preparing a high purity powder and a high purity semi-sintered body by removing impurities such as in particular oxygen and the like therefrom. A heating temperature is preferably set to 1150–1300° C. to effectively remove oxygen adsorbed to the crushed power. More specifically, when the heating temperature is less than 1150° C., it is difficult to obtain a low oxygen target containing oxygen in a amount not greater than 200 ppm by volatilizing and removing oxygen as silicon oxide (SiO or $SiO_2$). On the other hand, when the heating temperature exceeds 1300° C., a problem arises in that free Si is greatly volatilized and lost, and it is difficult to obtain a target having a predetermined composition, and further a semi-sintered body is cracked, sintering proceeds and an amount of contraction increases, and the semi-sintered body cannot be hot pressed in the state as it is. Consequently, a more preferable temperature range is 1200–1250° C.

In particular, when the heating temperature increases, since the semi-sintered body is liable to be cracked, it is preferable that the semi-sintered body is processed while applying a low pressing pressure thereto. The pressure is preferably in the range not greater than 10 kg/cm².

Further, the above heating temperature is preferably held for 1–8 hours. When the holding time is shorter than 1 hour, oxygen is insufficiently removed, whereas when the time exceeds 8 hours, a long time is needed and productivity is lowered as well as a large amount of Si is volatilized and lost, and the dislocation of the composition of a silicide target increases. Thus, the holding time is more preferably set to the range of 2–5 hours.

A degree of vacuum is preferably set to not higher than $10^{-3}$ Torr and further to not higher than $10^{-4}$ Torr to more effectively reduce oxygen by volatilizing silicon oxide. A further deoxidizing effect can be obtained and a target containing a less amount of oxygen can be obtained in such a manner that after the degree of vacuum is adjusted, hydrogen is introduced into a heating furnace and the target is heated in a pressure-reduced hydrogen atmosphere.

A vessel into which the crushed powder is charged may have a shape and size equal to those of a compacting mold to be used in a sintering process such as a hot pressing or the like to be described later or may be formed to a size determined by taking an amount of contraction of a semi-sintered body caused by calcination into consideration. As a result, there can be obtained an advantage that a deoxidized semi-sintered body can be easily inserted into the compacting mold and a plurality of semi-sintered bodies can be simultaneously sintered, and productivity can be greatly improved. The vessel is preferably composed of a high purity material of Mo, W, Ta, Nb or the like to prevent the contamination of the crushed powder by impurities and thermal deformation.

The crushed powder charged into the vessel is preferably smoothed by a dedicated pattern and made to flat by moving the powder forward and backward and in rotation so that the deoxidized semi-sintered body can be hot-pressed in the state as it is.

In a process IV, a crushed powder prepared in the process III or a semi-sintered body having been subjected to the impurity removing process is subjected to a main sintering and densification or compaction. The crushed powder or semi-sintered body having been subjected to the impurity removing process whose Si/M atomic ratio is adjusted to 2–4 and which is composed of $MSi_2$ and excessive Si is charged into the compacting mold and sintered and densified while setting a temperature and pressure at two steps.

The compacting mold to be used here is preferably a graphite compacting mold arranged such that, for example, a BN powder or the like having an exfoliation resistance at high temperature is coated on the inner surface of the mold with a spray or brush as a mold releasing agent and further a partition plate is applied onto the inside surface through a double-coated adhesive tape, adhesive or the like. The mold releasing agent is coated to prevent a compacting mold main body from being fused to the partition plate in hot pressing. The partition plate is provided to prevent the direct contact of the semi-sintered body with the mold releasing agent and isolate the former from the latter. As the partition plate, a refractory metal such as Mo, W, Ta, Nb etc. enduring high temperature in sintering and Ni, Ti etc. excellent in workability and processability is used by being formed to a thickness of 0.1–0.2 mm. When the partition plate is excessively thick, since its strength is increased, the formability of the plate is lowered when it is applied onto the compacting mold and workability is lowered as well as since the partition plate is adhered onto a sintered body, a long time is needed to remove it by grinding or the like. On the other hand, when the partition plate is too thin, since its strength is small, the plate is difficult to handle and workability is also lowered.

The fusion of the compacting mold with the partition plate is prevented as well as the mold releasing agent is not exfoliated and removed and the mixing of impurities contained in the mold releasing agent with a sintered body can be effectively prevented by coating the mold releasing agent on the inner surface of the mold and further using the compacting mold on which the partition plate is applied. In particular, even if BN is used as the mold releasing agent, the contamination of a target caused by inevitably contained impurities such as aluminium, iron etc. can be effectively prevented.

Next, sintering is carried out by applying a low pressing pressure of 10–50 kg/cm$^2$ in a high vacuum not higher than $10^{-3}$ Torr and increasing a temperature up to just below an eutectic temperature stepwise or at a small temperature increasing rate.

A pressing pressure is preferably set to 10–50 kg/cm$^2$ at a first step because the pressure affects the remaining of aggregated silicon and the grain size of $MSi_2$. When the pressing pressure is less than 10 kg/cm$^2$, $MSi_2$ grains grow as well as a composition is not uniformly distributed. On the other hand, when the pressure is not less than 50 kg/cm$^2$, the ductile flow of free Si is suppressed and aggregated Si remains, and a structure in which Si is not uniformly dispersed is obtained. The pressure is more preferably 20–30 kg/cm$^2$.

When sintering is carried out by increasing a temperature up to just below an eutectic temperature while applying a pressure, heating is preferably effected stepwise or at a low temperature increasing rate to suppress the growth of $MSi_2$ grains. A temperature increasing width is preferably 20–200° C. When the temperature increasing width is less than 20° C., a long time is needed for sintering and productivity is lowered, whereas when the width exceeds 200° C., $MSi_2$ grains are grown by an abrupt temperature increases as well as a composition has an inclined distribution in a target plane due to the flow of free Si. Further, each temperature is preferably held for 0.1–3 hours. When the holding time is less than 0.5 hour, the temperature of a sintered body in a mold is not uniformly distributed, whereas when the time exceeds 2 hours, a long time is needed and productivity is lowered. Thus, it is more preferable that the temperature increasing width is set to the range of 50–100° C. and the holding time is set to the range of 0.5–2 hours.

Further, when a heating rate exceeds 20° C./minute in the heating effected at a low rate, $MSi_2$ grains are coarsened. Thus, the heating rate is preferably set to not higher than 20° C./minute. Further, when the heating rate is less than 3° C./minute, since a long time is needed to sintering operation and productivity is lowered, it is preferably set to the range of 3–20° C./minute and more preferably to the range of 5–10° C./minute.

A final sintering temperature T is preferably set to just below an eutectic temperature, i.e., to the range of Ts−50≦T<Ts. When, for example, W, Mo, Ti, Ta are used as M, the eutectic temperature Ts is 1400, 1410, 1330, 1385° C., respectively. Note, the eutectic temperature Ts can be easily obtained by referring to literatures such as "Constitution of Binary Alloys" (Dr. phil. Max Hansen and Dr. Kurt Anderko; McGraw-Hill Book Company, 1958) and the like. When T is not higher than (Ts−50), pores remain and a desired high density target cannot be obtained, whereas when T is not less than Ts, free Si is melted and flows out from the compacting mold and a target with a dislocated composition is obtained.

Since a pressing pressure at a second step affects the density of a resultant sintered body, the pressure is preferably set to 200–500 kg/cm². When the pressing pressure is less than 200 kg/cm², a sintered body with a density not less than 99% cannot be obtained, whereas when the pressure is not less than 500 kg/cm², a graphite compacting mold is liable to be broken. Thus, the pressing pressure is more preferably set to the range of 300–400 kg/cm².

The pressing pressure is preferably applied in 1–5 hours after a final temperature is reached. When the period of time is less than 1 hour, the temperature of a semi-sintered body in a mold is not made uniform and when the pressing pressure is applied in this state, a problem arises in that a uniform density distribution and uniform structure cannot be obtained due to an irregular temperature distribution. On the other hand, when the time exceeds 5 hours, although the temperature of the semi-sintered body in the mold is completely made uniform, the holding of the semi-sintered body longer than this time lowers productivity. Thus, the holding time is preferably 2–3 hours.

Further, the pressing pressure is preferably held for 1–8 hours. When the holding time is not longer than 1 hour, many pores remain and a high density target cannot be obtained, whereas when it is not shorter than 8 hours, since densification does not further proceed, the manufacturing efficiency of a target is lowered. Thus, the holding time is more preferably 3–5 hours. The sintering for the densification is preferably carried out in vacuum to prevent the contamination caused by the mixture of impurities.

An intended sputtering target can be finally obtained by machining a resultant sintered body to a predetermined shape. At that time, it is preferable to finish the sintered body by a machining method which does not produce a surface defect on the surface of the target.

A high purity silicide thin film can be formed by effecting sputtering using the target. Further, various electrodes such as a gate electrode, source electrode, drain electrode and thin film for a semiconductor device and a thin film for wiring materials can be formed by subjecting the thin film to etching and the like.

BEST MODE FOR CARRYING OUT THE INVENTION

Figure 1A:
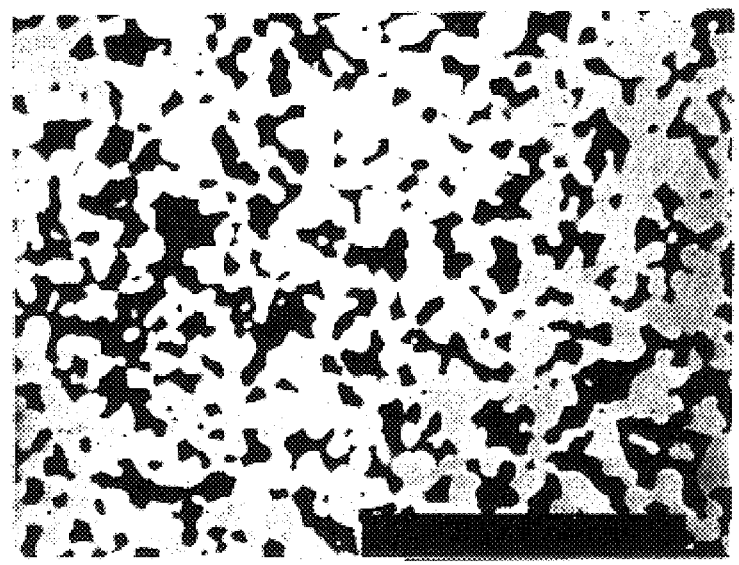
FIGS. 1A and 1B are electron microphotographs showing the metal structures of the polished surface and fracture surface of a target according to Example 1, respectively.
Figure 1B:
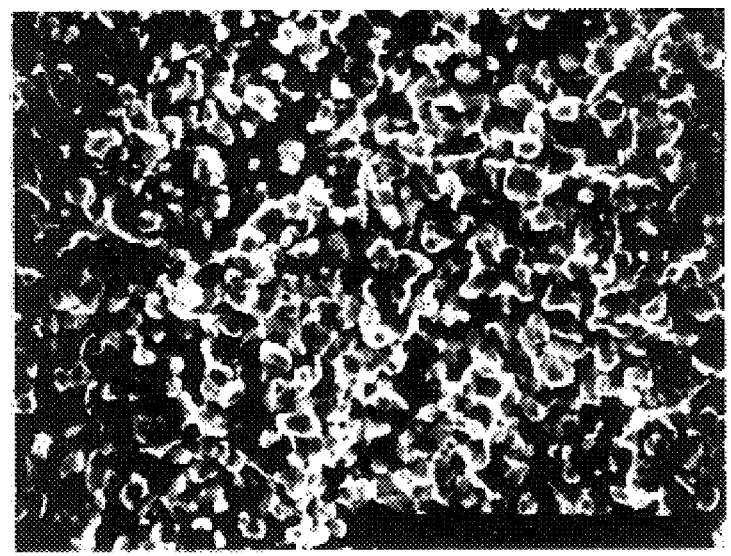
Figure 2A:
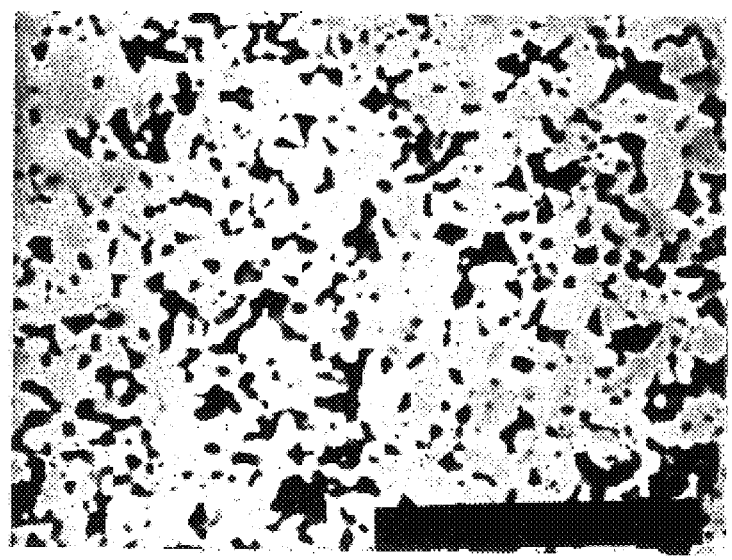
FIGS. 2A and 2B are electron microphotographs showing the metal structures of the polished surface and fracture surface of a target according to Example 6, respectively.
Figure 2B:
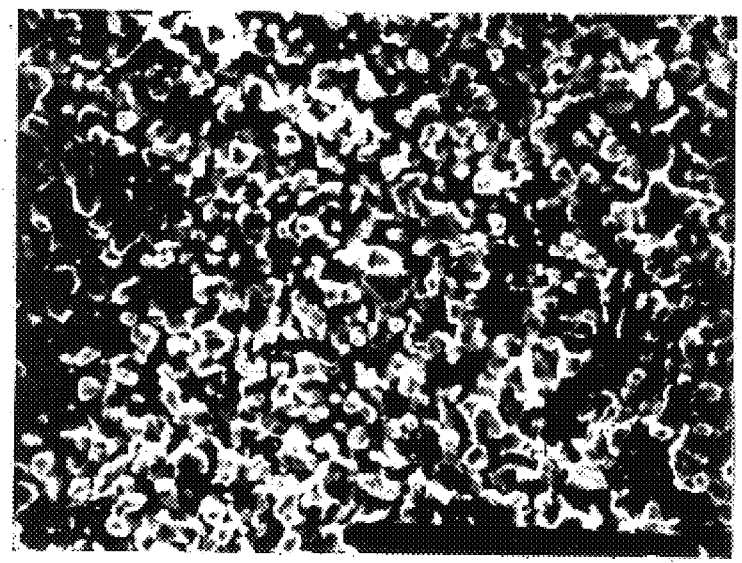
Figure 3A:
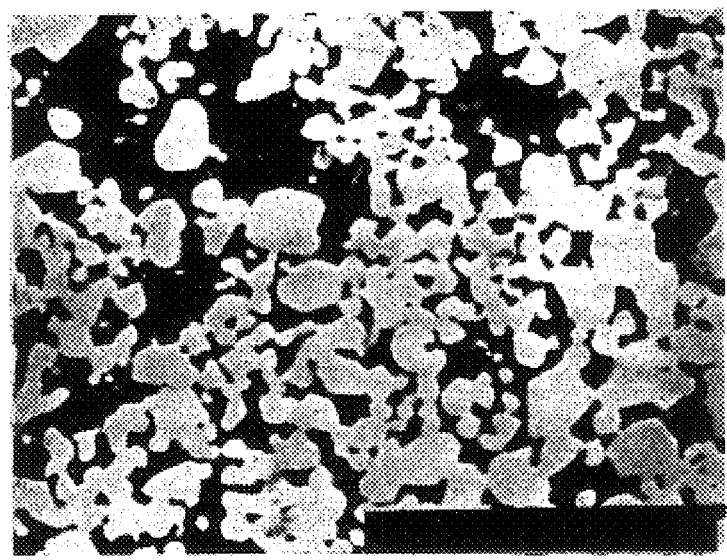
FIGS. 3A and 3B are electron microphotographs showing the metal structures of the polished surface and fracture surface of a target according to Comparative Example 1, respectively.
Figure 3B:
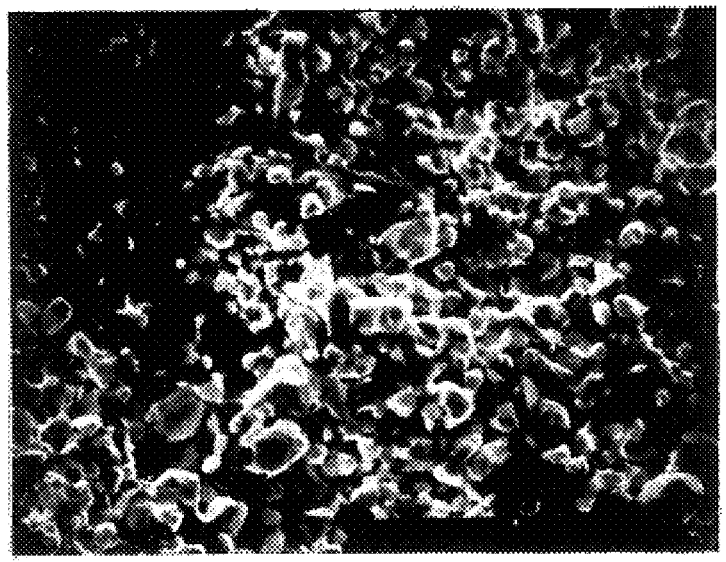
Figure 4A:
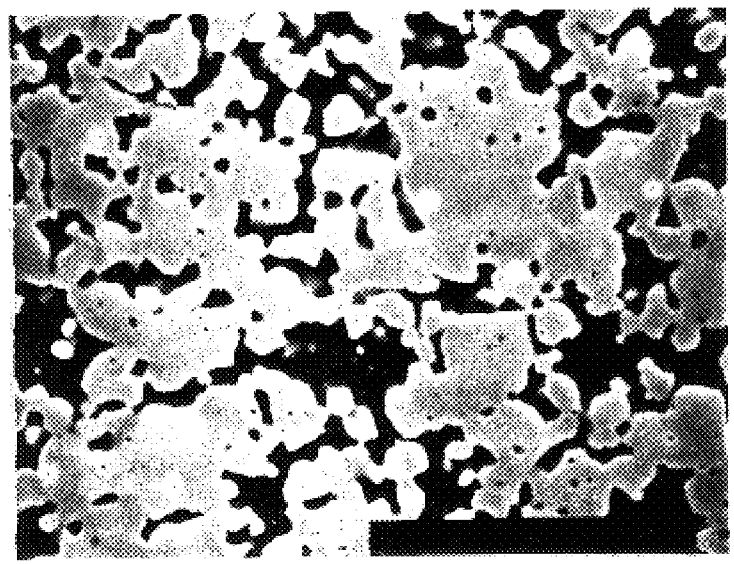
FIGS. 4A and 4B are electron microphotographs showing the metal structures of the polished surface and fracture surface of a target according to Comparative Example 4, respectively.
Figure 4B:

An arrangement and advantage of the present invention will be described in more detail with reference to the following examples.

EXAMPLES 1–10

A high purity M powder (M: W, Mo shown in Table 1) having a maximum grain size of 15 $\mu$m and a high purity Si powder having a maximum grain size of 30 $\mu$m were prepared and the respective powders were charged into a ball mill the inside of which was lined with high purity Mo together with high purity Mo balls and then mixed for 48 hours with the replacement with an Ar gas. Each of the resultant mixed powders was charged into a high purity Mo vessel with a charging depth set to 3 mm when M=Mo (weight to be charged was about 250 g) and to 10 mm when M=W (weight to be charged was about 750 g) and silicide was synthesized in such a manner that the temperature of the vessel was increased stepwise from 950° C. to 1300° C. with a temperature width in each step of 50° C. in a vacuum not higher than $1 \times 10^{-4}$ Torr using a vacuum furnace having a Mo heater and Mo insulator with a holding time at each step of temperature set to 1 hour. The high purity materials used had a purity not less than 5N (not less than 99.999%).

Next, each of semi-sintered bodies obtained by synthesizing the silicide was charged into a ball mill the inside of which was lined with high purity Mo together with high purity Mo balls and then crushed and pulverized for 72 hours with the replacement of the inner atmosphere of the ball mill with an Ar gas. The resultant crushed powder was charged into a high purity Mo vessel having a diameter of 280 mm and deoxidized by heating the vessel at 1250° C. for 4 hours in a vacuum not higher than $10^{-4}$ Torr.

Further, the resultant semi-sintered body (about 280 mm in diameter and 40 mm thick) was set to a graphite compacting mold lined with a Ta foil, heated to 1000° C. in a vacuum not higher than $10^{-4}$ Torr and then heated stepwise up to 1380° C. with a temperature width in each step of 50° C. while applying a pressing pressure of 20 kg/cm² thereto with a holding time at each step of temperature set to 1 hour. Then, the semi-sintered body was hot pressed by a pressing pressure of 300 kg/cm² applied thereto in 2 hours after the temperature of the semi-sintered body had reached 1380° C., so that a sintered body having a diameter of 280 mm and a thickness of 14 mm was prepared.

The resultant sintered body was subjected to grinding, polishing and electric discharging processes and finished to a target having a diameter of 258 mm and a thickness of 10 mm.

COMPARATIVE EXAMPLES 1–6

As Comparative Examples 1–6, an M powder equal to that used in Examples 1–10 was mixed with a Si powder having a maximum grain size of 50 $\mu$m and silicide was synthesized in such a manner that each of the resultant mixed powders was charged into a vacuum vessel having a conventional carbon (C) heater and carbon (C) insulator and heated to 1300° C. at a rate of 10° C./min in a vacuum not higher than $1 \times 10^{-4}$ Torr with a charging depth set to 6 mm when M=Mo and to 20 mm when M=W.

Next, the crushed powder was charged into in a graphite compacting mold without being deoxidized and heated to 1000° C. in vacuum and then heated up to 1380° C. while applying a pressing pressure of 200 kg/cm² thereto, held for 2 hours and then hot pressed, in the same way as that of Example 1, so that sintered bodies each having a diameter of 280 mm and a thickness of 14 mm were prepared.

The cross-sectional structures of Example 1–10 and Comparative Examples 1–6 were observed under a scanning type electron microscope (SEM) and the number of $MSi_2$ independently existing in a cross section of 0.01 mm², the average grain size of $MSi_2$ and the maximum grain size of Si were measured. Table 1 shows the result of measurement. Further, FIGS. 1A, 2A, 3A and 4A show electron microphotographs of the metal structures of the polished surfaces of target sintered bodies relating to Examples 1 and 6 and Comparative Examples 1 and 4, respectively. FIGS. 1B, 2B, 3B and 4B show electron microphotographs of the metal structures of the fracture surfaces of the above target sintered bodies, respectively. Note, the measured values are average values determined by examining a cross section at 20 positions. Further, a grain size is shown by the diameter of a minimum circle circumscribing a grain.

chain, the less number of $MSi_2$ independently exist, and Si is dispersed in the gaps of the $MSi_2$ and further $MSi_2$ and Si have a small grain size as compared with Comparative Examples 1–6. More specifically, it is found that in the metal structures of the targets of the examples shown in FIGS. 1 and 2, a mixed structure is formed such that fine $MSi_2$ grains shown by gray portions are coupled with each other like a chain and fine Si grains shown by black portions disperse among them, whereas in the metal structures of the targets of the comparative examples shown in FIGS. 3 and 4, coarse $MSi_2$ grains (gray portions) and Si grains (black portions) grow as well as a ratio of fine $MSi_2$ grains independently existing in a Si phase is increased and thus the targets have a structure in which particles are liable to be generated.

Table 1 also shows the result of analysis of a Si/W atom ratio in a cross section of 1 mm² of the mixed structure of each target effected by a surface analyzing instrument (X-ray microanalyzer: EPMA). It is found from the result of analysis that the Examples 1–10 have compositions nearer to an intended composition as compared with the Comparative Examples 1–6 and further have uniform compositions.

TABLE 1

| SPECIMEN No. | AVERAGE COMPOSITION OF TARGET | NUMBER OF INDEPENDENT $MSi_2$ (PIECES) | AVERAGE GRAIN SIZE OF $MSi_2$ ($\mu$m) | MAXIMUM GRAIN SIZE OF Si ($\mu$m) | DISPERSION OF COMPOSITION (Si/M ATOMIC RATIO) |
|---|---|---|---|---|---|
| EXAMPLE 1 | $WSi_{2.8}$ | 8 | 8 | 14 | 2.80 ± 0.01 |
| EXAMPLE 2 | $WSi_{2.8}$ | 5 | 5 | 15 | 2.80 ± 0.01 |
| EXAMPLE 3 | $WSi_{2.8}$ | 8 | 5 | 11 | 2.80 ± 0.01 |
| EXAMPLE 4 | $WSi_{2.8}$ | 10 | 6 | 9 | 2.80 ± 0.01 |
| EXAMPLE 5 | $WSi_{2.8}$ | 14 | 7 | 13 | 2.80 ± 0.01 |
| EXAMPLE 6 | $MoSi_{2.7}$ | 7 | 8 | 14 | 2.70 ± 0.01 |
| EXAMPLE 7 | $MoSi_{2.7}$ | 6 | 7 | 9 | 2.70 ± 0.01 |
| EXAMPLE 8 | $MoSi_{2.7}$ | 8 | 9 | 10 | 2.70 ± 0.01 |
| EXAMPLE 9 | $MoSi_{2.7}$ | 11 | 6 | 11 | 2.70 ± 0.01 |
| EXAMPLE 10 | $MoSi_{2.7}$ | 14 | 6 | 7 | 2.70 ± 0.01 |
| COMPARATIVE EXAMPLE 1 | $WSi_{2.8}$ | 17 | 18 | 35 | 2.75 ± 0.03 |
| COMPARATIVE EXAMPLE 2 | $WSi_{2.8}$ | 24 | 21 | 42 | 2.74 ± 0.03 |
| COMPARATIVE EXAMPLE 3 | $WSi_{2.8}$ | 30 | 20 | 32 | 2.72 ± 0.04 |
| COMPARATIVE EXAMPLE 4 | $MoSi_{2.7}$ | 19 | 22 | 28 | 2.63 ± 0.03 |
| COMPARATIVE EXAMPLE 5 | $MoSi_{2.7}$ | 26 | 24 | 38 | 2.61 ± 0.03 |
| COMPARATIVE EXAMPLE 6 | $MoSi_{2.7}$ | 34 | 25 | 42 | 2.60 ± 0.04 |

As is apparent from the result shown in Table 1 and FIG. 1-FIG. 4, Examples 1–10 have a fine uniform structure in which $MSi_2$ grains are linked or coupled with each other like Table 2 shows the result of measurement of the densities of the respective targets and the result of analysis of oxygen, carbon, iron and aluminium.

TABLE 2

| SPECIMEN No. | AVERAGE COMPOSITION OF TARGET | DISPERSION OF DENSITY RATIO (%) | AMOUNT OF IMPURITY (ppm) | | | | NUMBER OF PARTICLES (PIECES) |
|---|---|---|---|---|---|---|---|
| | | | $O_2$ | C | Fe | Al | |
| EXAMPLE 1 | $WSi_{2.8}$ | 99.8 ± 0.1 | 153 | 35 | 0.3 | 0.2 | 5 |
| EXAMPLE 2 | $WSi_{2.8}$ | 99.7 ± 0.1 | 130 | 28 | 0.2 | 0.3 | 12 |
| EXAMPLE 3 | $WSi_{2.8}$ | 99.7 ± 0.2 | 186 | 24 | 0.4 | 0.1 | 19 |
| EXAMPLE 4 | $WSi_{2.8}$ | 99.8 ± 0.1 | 120 | 31 | 0.5 | 0.3 | 25 |
| EXAMPLE 5 | $WSi_{2.8}$ | 99.8 ± 0.1 | 87 | 19 | 0.4 | 0.3 | 30 |
| EXAMPLE 6 | $MoSi_{2.7}$ | 99.7 ± 0.2 | 95 | 24 | 0.3 | 0.1 | 6 |
| EXAMPLE 7 | $MoSi_{2.7}$ | 99.7 ± 0.1 | 122 | 18 | 0.2 | 0.2 | 11 |
| EXAMPLE 8 | $MoSi_{2.7}$ | 99.8 ± 0.1 | 105 | 27 | 0.4 | 0.4 | 20 |
| EXAMPLE 9 | $MoSi_{2.7}$ | 99.8 ± 0.1 | 145 | 36 | 0.3 | 0.2 | 24 |

TABLE 2-continued

| SPECIMEN No. | AVERAGE COMPOSITION OF TARGET | DISPERSION OF DENSITY RATIO (%) | AMOUNT OF IMPURITY (ppm) | | | | NUMBER OF PARTICLES (PIECES) |
|---|---|---|---|---|---|---|---|
| | | | $O_2$ | C | Fe | Al | |
| EXAMPLE 10 | $MoSi_{2.7}$ | 99.7 ± 0.1 | 116 | 33 | 0.3 | 0.1 | 33 |
| COMPARATIVE EXAMPLE 1 | $WSi_{2.8}$ | 99.0 ± 0.3 | 893 | 128 | 1.8 | 1.4 | 235 |
| COMPARATIVE EXAMPLE 2 | $WSi_{2.8}$ | 98.8 ± 0.4 | 952 | 133 | 2.3 | 1.6 | 280 |
| COMPARATIVE EXAMPLE 3 | $WSi_{2.8}$ | 98.5 ± 0.3 | 1025 | 121 | 2.1 | 1.2 | 322 |
| COMPARATIVE EXAMPLE 4 | $MoSi_{2.7}$ | 99.1 ± 0.3 | 1230 | 158 | 3.4 | 2.4 | 256 |
| COMPARATIVE EXAMPLE 5 | $MoSi_{2.7}$ | 98.8 ± 0.4 | 1304 | 168 | 2.8 | 2.6 | 293 |
| COMPARATIVE EXAMPLE 6 | $MoSi_{2.7}$ | 98.6 ± 0.4 | 1156 | 150 | 3.1 | 2.1 | 335 |

As apparent from the result shown in Table 2, since the target relating Examples 1–10 have a density ratio not less than 99.5%, it found that Examples 1–10 have a very small content of impurities as compared with Comparative Examples 1–6.

The respective sputtering targets relating to Examples 1–10 and Comparative Examples 1–6 were set to a magnetron sputtering apparatus and sputtered under the condition of an argon pressure of $2.3 \times 10^{-3}$ Torr and a silicide film was deposited on a 6 inch Si wafer to about 3000 Å thick. The same operation was effected 10 times and an amount of mixed particles having a particle size not less than 0.2 μm was measured and Table 2 also shows the result of the measurement. As apparent from the result shown in Table 2, it is found that according to the targets relating to Examples 1–10, the number of particles mixed onto the 6 inch wafer is not greater than 33 and very small, whereas according to Comparative Examples 1–6, a lot of particles which are about 10 times those of Examples 1–10 are generated.

EXAMPLE 11

4658 g of a high purity (5N) W powder having a maximum grain size of 8 μm and 1992 g of a high purity (5N) Si powder having a maximum grain size of 30 μm were prepared, the respective powders were charged into a ball mill the inside of which was lined with high purity Mo together with high purity Mo balls and then mixed for 48 hours with the replacement of the inner atmosphere of the ball mill with an argon gas. The resultant mixed powder having a Si/W atomic ratio of 2.80 was divided to each charging depth of 3 mm (weight to be charged was about 250 g) and charged into a high purity Mo vessel and silicide was synthesized in such a manner that the temperature of the vessel was increased stepwise from 950° C. to 1300° C. with a temperature width in each step of 50° C. in a vacuum not higher than $1 \times 10^{-4}$ Torr using a vacuum furnace having a Mo heater and Mo insulator with a holding time at each step of temperature set to 1 hour, so that semi-sintered bodies of Example 11 were prepared.

COMPARATIVE EXAMPLES 7–8

On the other hand, a semi-sintered body was prepared as Comparative Example 7 by heating all the amount of the mixed powder for a single sheet of a target prepared in Example 11 from 950° C. to 1300° C. in vacuum at a temperature increasing rate of 10° C./minute. In addition, a semi-sintered body was prepared as Comparative Example 8 by dividing a mixed powder similar to that of Example 11 to each charging depth of 3 mm and then continuously heating the powder up to 1300° C. at a temperature increasing rate of 10° C./minute in a vacuum not higher than $1 \times 10^{-4}$ Torr.

Figure 5:
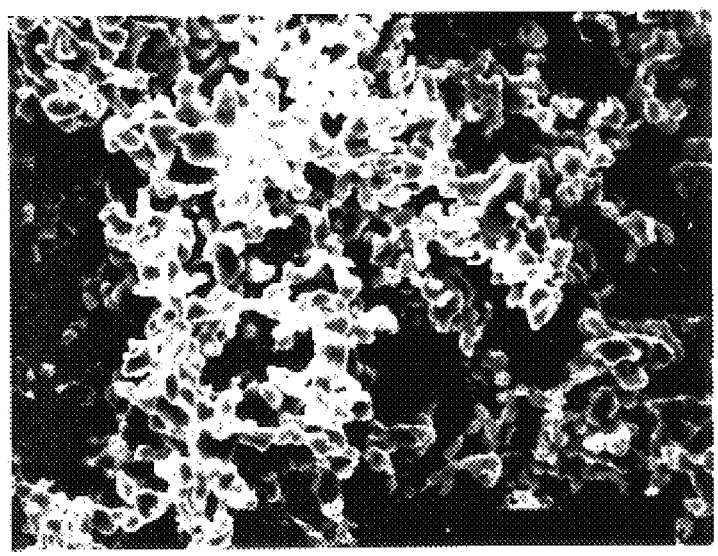
FIG. 5 is an electron microphotograph showing the metal structure of the surface of a target semi-sintered body according to Example 11.
Figure 6:
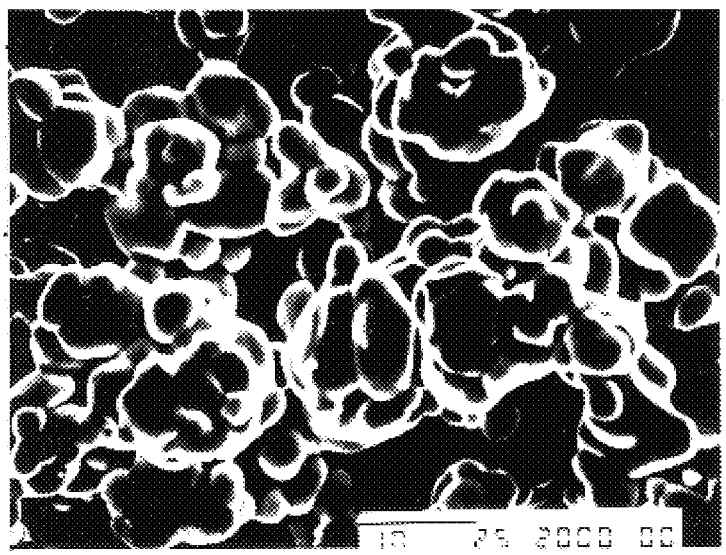
FIG. 6 is an electron microphotograph showing the metal structure of the surface of a target semi-sintered body according to Comparative Example 7.
Figure 7:
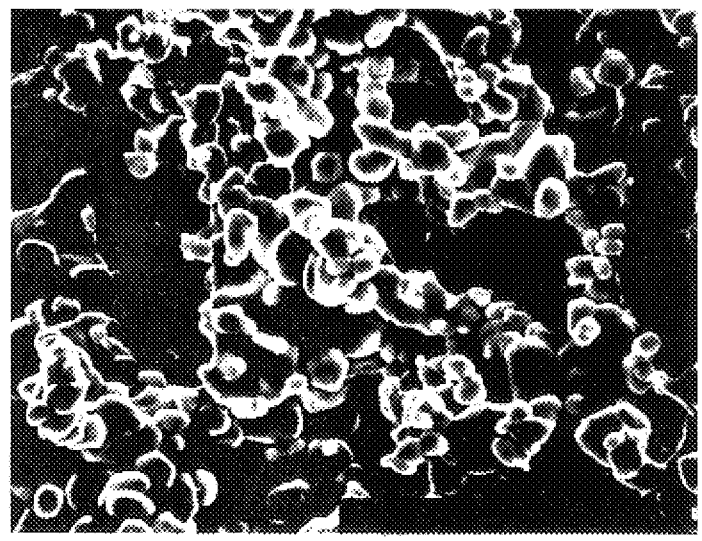
FIG. 7 is an electron microphotograph showing the metal structure of the surface of a target semi-sintered body according to Comparative Example 8.

The surface metal structures of respective target semi-sintered bodies of Example 11, Comparative Examples 7 and 8 were magnified and observed under a scanning type electron microscope (SEM) and microphotographs shown in FIGS. 5, 6 and 7 were obtained. Then, as the result of examination of the maximum grain sizes of $WSi_2$ grains and Si grains constituting the respective metal structures in FIG. 5–FIG. 7, it can be confirmed that the grain sizes of the respective grains in Example 11 are smaller than those of Comparative Examples 7 and 8 and a fine structure is formed and the generation of particles are more lowered in Example 11.

Table 3 shows the result of analysis of the compositions of the semi-sintered bodies obtained by synthesization. As a result, the degree of dislocation of the composition of Example 11 is smaller than those of Comparative Examples 7 and 8.

EXAMPLE 12

2850 g of a high purity (5N) Mo powder having a maximum grain size of 5 μm and 2250 g of a high purity (5N) Si powder having a maximum grain size of 30 μm were prepared, the respective powders were charged into a ball mill the inside of which was lined with high purity Mo together with high purity Mo balls and then mixed for 48 hours with the replacement of the inner atmosphere of the ball mill with an Ar gas. The resultant mixed powder having a Si/W atomic ratio of 2.70 was divided to each charging depth of 1.5 mm (weight to be charged was about 100 g) and charged into a high purity Mo vessel, silicide was synthesized in such a manner that the temperature of the vessel was increased stepwise from 900° C. to 1250° C. with a temperature width in each step of 50° C. in a vacuum not higher than $1 \times 10^{-4}$ Torr using a vacuum furnace having a Mo heater and a Mo insulator with a holding time at each step of temperature set to 1 hour, so that a semi-sintered body of Example 12 was prepared.

COMPARATIVE EXAMPLES 9–10

On the other hand, a semi-sintered body was prepared as Comparative Example 9 by heating all the amount of the mixed powder for a single sheet of the target prepared in Example 12 from 900° C. to 1250° C. in the same vacuum at a temperature increasing rate of 10° C./minute. In addition, a semi-sintered body was prepared as Comparative Example 10 by dividing a mixed powder equal to that of Example 12 to each charging depth of 1.5 mm and then continuously heating the powder up to 1250° C. at a heating rate of 10° C./minute in a vacuum not higher than $1 \times 10^{-4}$ Torr.

Figure 8:
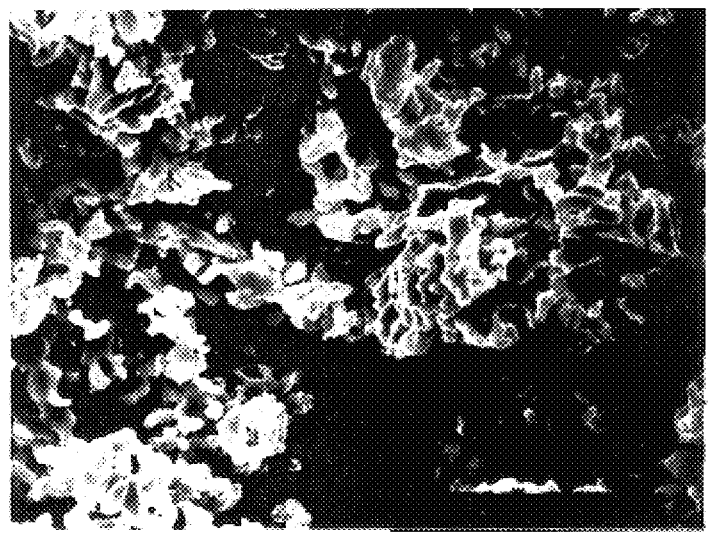
FIG. 8 is an electron microphotograph showing the metal structure of the surface of a target semi-sintered body according to Example 12.
Figure 9:
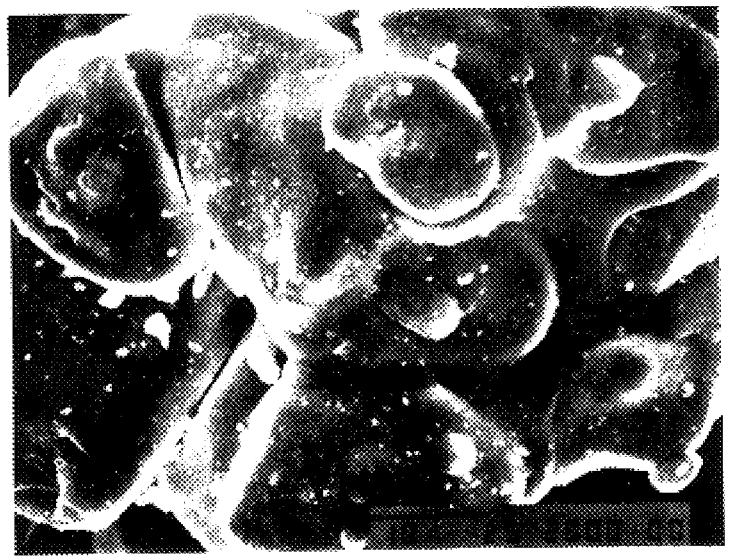
FIG. 9 is an electron microphotograph showing the metal structure of the surface of a target semi-sintered body according to Comparative Example 9.
Figure 10:
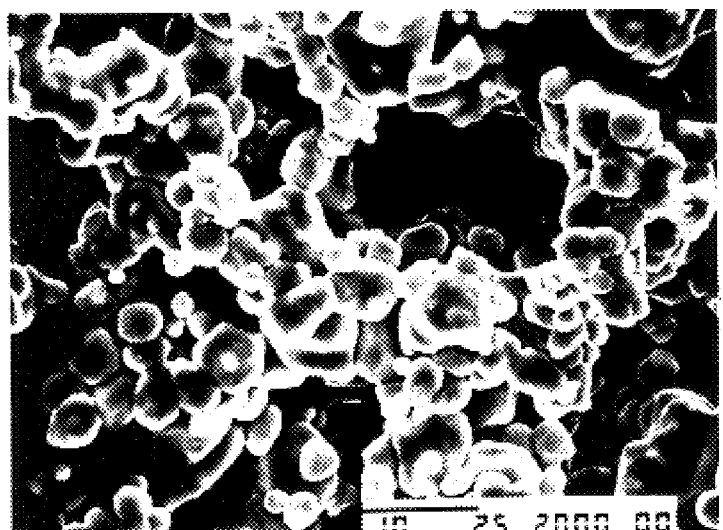
FIG. 10 is an electron microphotograph showing the metal structure of the surface of a target semi-sintered body according to Comparative Example 10.

The surface metal structures of respective target semi-sintered bodies of Example 12, Comparative Examples 9 and 10 were magnified and observed under a scanning type electron microscope (SEM) and microphotographs shown in FIGS. 8, 9 and 10 were obtained, respectively. Then, as the result of measurement of the grain size of $MoSi_2$ grains (gray portions) and Si grains (black portions) constituting respective metal structures and analysis of dispersion of the compositions of the respective semi-sintered bodies in FIGS. 8–10, the result shown in Table 3 was obtained.

TABLE 3

| SPECIMEN No. | AVERAGE COMPOSITION OF SEMI-SINTERED BODY | DISPERSION OF SEMI-SINTERED BODY COMPOSITION |
|---|---|---|
| EXAMPLE 11 | $WSi_{2.79}$ | $2.79 \pm 0.01$ |
| EXAMPLE 12 | $MoSi_{2.68}$ | $2.68 \pm 0.01$ |
| COMPARATIVE EXAMPLE 7 | $WSi_{2.65}$ | $2.65 \pm 0.03$ |
| COMPARATIVE EXAMPLE 8 | $WSi_{2.69}$ | $2.69 \pm 0.04$ |
| COMPARATIVE EXAMPLE 9 | $MoSi_{2.45}$ | $2.45 \pm 0.03$ |
| COMPARATIVE EXAMPLE 10 | $MoSi_{2.56}$ | $2.56 \pm 0.04$ |

As is apparent from the result shown in Table 3 and FIGS. 8–10, the grain size of $MoSi_2$ grains in Example 12 is smaller than that of Comparative Examples 9 and 10 and Example 12 can obtain a fine uniform metal structure with a small grain size.

Further, as the result of analysis of the compositions of the semi-sintered bodies obtained by the synthesization, it is found that Example 12 can provide a target whose composition is less dislocated than the targets of Comparative Examples 9 and 12 and which is more homogeneous than the targets thereof.

Next, a difference of deoxidizing effects will be described.

EXAMPLE 13

The semi-sintered body obtained in Example 11 was charged into a ball mill the inside of which was lined with a high purity Mo material together with high purity Mo balls and crushed for 48 hours with the replacement of the inner atmosphere of the ball mill with an Ar gas. The resultant crushed powder was charged into a high purity Mo vessel having a diameter of 280 mm and the vessel was heated at 1250° C. for 4 hours in a vacuum not higher than $1\times10^{-4}$ Torr.

EXAMPLE 14

On the other hand, a mixed powder equal to that of Example 13 was heated at 1100° C. for 4 hours in a vacuum not higher than $1\times10^{-4}$ Torr as Example 14.

Table 4 shows the result of analysis of oxygen in the respective semi-sintered bodies of Example 13 and Example 14.

As is apparent from the result shown in Table 4, it is confirmed that an oxygen content of Example 13 is reduced to about ⅓ that of Example 14.

EXAMPLE 15

The semi-sintered body obtained in Example 12 was charged into a ball mill the inside of which was lined with a high purity Mo material together with high purity Mo balls and crushed for 48 hours with the replacement of the inner atmosphere of the ball mill with an Ar gas. The resultant crushed powder was charged into a high purity Mo vessel having a diameter of 280 mm and the vessel was heated at 1250° C. for 4 hours in a vacuum not higher than $1\times10^{-4}$ Torr.

EXAMPLE 16

On the other hand, a mixed powder equal to that of Example 15 was heated at 1100° C. for 4 hours in a vacuum not higher than $1\times10^{-4}$ Torr as Example 16.

Table 4 shows the result of analysis of oxygen content in the respective semi-sintered bodies of Example 15 and Example 16.

EXAMPLE 17

The semi-sintered body obtained in Example 11 was charged into a ball mill the inside of which was lined with a Mo high purity material together with high purity Mo balls and crushed for 48 hours with the replacement of the inner atmosphere of the ball mill with an Ar gas. The resultant crushed powder was charged into a high purity Mo vessel having a diameter of 280 mm, the vessel was evacuated to $1\times10^{-4}$ Torr and hydrogen was introduced into the vessel and then the vessel was heated at 1250° C. for 4 hours in an atmosphere reduced to 0.1 Torr. Table 4 shows the result of analysis of the oxygen content of the resultant specimens (semi-sintered bodies).

TABLE 4

| SPECIMEN No. | AMOUNT OF OXYGEN (ppm) |
|---|---|
| EXAMPLE 13 | 110 |
| EXAMPLE 14 | 380 |
| EXAMPLE 15 | 140 |
| EXAMPLE 16 | 140 |
| EXAMPLE 17 | 85 |

As is apparent from the result shown in Table 4, according to Example 15, the oxygen content of the semi-sintered body is reduced to about ⅓ that of Example 16.

Further, as shown in Example 17, a higher deoxidizing effect can be obtained when impurities are removed in a reduced pressure atmosphere with hydrogen introduced thereinto rather than when they are removed in a simple vacuum atmosphere.

As described above, the semi-sintered bodies of the refractory metal silicide obtained by the manufacturing method of the examples can easily provide a target with a low oxygen content because the semi-sintered bodies contain a very small amount of oxygen. As a result, the employment of the target can reduce a film resistance and improve the reliability of semiconductor devices.

EXAMPLES 18–23

A high purity W powder or high purity Mo powder each having a maximum grain size of 15 μm was mixed with a high purity Si powder having a maximum grain size of 30 μm, and silicide was synthesized by heating the resultant mixed powder in vacuum. Further, many semi-sintered bodies of 280 mm in diameter and 40 mm thick having an average composition of $WSi_{2.8}$ or $MoSi_{2.7}$ were prepared in such a manner that a semi-sintered body obtained by synthesizing the silicide was crushed in a ball mill and the resultant crushed powder was deoxidized by being heated in vacuum.

Next, silicide targets relating to Examples 18–23, respectively were made by subjecting the resultant semi-sintered bodies obtained to hot pressing under a pressing condition and heating condition each composed of two steps shown in Table 5. Note, the heating condition was such that the semi-sintered bodies were continuously heated up to 1000° C. at a temperature increasing rate of 5–20° C./minute and then heated stepwise from 1000° C. to 1380° C. with a temperature width in each step of 50–150° C.

COMPARATIVE EXAMPLES 11–15

On the other hand, the semi-sintered bodies used in Examples 19–23 were hot pressed under a pressing condition and heating conditions each composed of two steps, and silicide targets relating to Comparative Examples 11–15 were made.

The mixed structures of the resultant silicide targets relating to Examples 18–23 and Comparative Examples 11–15 were observed under a scanning type electron microscope and the average grain size of $WSi_2$ grains and $MoSi_2$ grains and the maximum grain size of Si grains constituting the mixed structures were measured and the compositions of the respective silicide targets were analyzed at the center portions and end portions thereof. Table 5 shows the result of the measurement and analysis.

the targets of Comparative Examples 11, 13, 14, since a Si component is restricted and plastic flowing is difficult to occur, Si grains are coarsened and a fine mixed structure cannot be obtained.

Further, it is also found that when targets are abruptly heated under a low pressing pressure as in the targets of Comparative Examples 12 and 15, $MSi_2$ grains grow and a fine structure cannot be obtained likewise.

EXAMPLES 24–34

A high purity M (M: W, Mo, Ti, Zr, Hf, Nb, Ta, V, Co, Cr, Ni shown in Table 6) powder having a maximum grain size of 15 μm and a high purity Si powder having a maximum grain size of 30 μm were prepared and the respective powders were charged into a ball mill the inside of which was lined with high purity Mo together with high purity Mo balls and mixed for 48 hours with the replacement of the inner atmosphere of the ball mill with an Ar gas. The resultant respective mixed powders were charged into a high purity Mo vessel. The depth and weight of the mixed powders to be charged were set to 5 mm and about 2000 g, respectively. The vessel was then heated stepwise in the temperature range from 800° C. to 1300° C. (different

TABLE 5

| SPECIMEN No. | AVERAGE COMPOSITION OF TARGET | PRESSURIZING CONDITIONS | | HEATING CONDITIONS | | AVERAGE GRAIN SIZE OF $MSi_2$ (μm) | MAXIMUM GRAIN SIZE OF Si (μm) | COMPOSITION OF TARGET (Si/M ATOMIC RATIO) | |
|---|---|---|---|---|---|---|---|---|---|
| | | 1st STEP (kg/cm²) | 2nd STEP (kg/cm²) | TEMPERATURE WIDTH (° C.) | HOLDING PERIOD OF TIME (hr) | | | END PORTION | CENTER PORTION |
| EXAMPLE 18 | $WSi_{2.8}$ | 20 | 300 | 50 | 1 | 8 | 8 | 2.78 | 2.79 |
| EXAMPLE 19 | $WSi_{2.8}$ | 30 | 300 | 100 | 2 | 7 | 10 | 2.79 | 2.79 |
| EXAMPLE 20 | $WSi_{2.8}$ | 40 | 300 | 150 | 3 | 5 | 14 | 2.79 | 2.79 |
| EXAMPLE 21 | $MoSi_{2.7}$ | 10 | 300 | 50 | 1 | 7 | 7 | 2.68 | 2.69 |
| EXAMPLE 22 | $MoSi_{2.7}$ | 20 | 300 | 100 | 2 | 6 | 10 | 2.69 | 2.69 |
| EXAMPLE 23 | $MoSi_{2.7}$ | 30 | 300 | 150 | 3 | 5 | 14 | 2.69 | 2.69 |
| COMPARATIVE EXAMPLE 11 | $WSi_{2.8}$ | 250 | 300 | 100 | 2 | 6 | 25 | 2.79 | 2.79 |
| COMPARATIVE EXAMPLE 12 | $WSi_{2.8}$ | 30 | 300 | 400 | 1 | 12 | 12 | 2.77 | 2.80 |
| COMPARATIVE EXAMPLE 13 | $MoSi_{2.7}$ | 150 | 300 | 50 | 1 | 6 | 22 | 2.68 | 2.69 |
| COMPARATIVE EXAMPLE 14 | $MoSi_{2.7}$ | 200 | 300 | 100 | 2 | 8 | 27 | 2.68 | 2.69 |
| COMPARATIVE EXAMPLE 15 | $MoSi_{2.7}$ | 0 | 300 | 400 | 1 | 15 | 15 | 2.65 | 2.69 |

In the targets relating to Examples 18–23, since Si plastically flows, disperses and moves to the gaps of the semi-sintered bodies and fills the gaps under the condition of a low pressing pressure, a less amount of Si is segregated and uniformly dispersed. Thus, as apparent from the result shown in Table 5, the $WSi_2$ grains, $MoSi_2$ grains and Si grains of the targets of the respective examples have grain sizes smaller than those of the comparative examples, so that fine and miniaturized mixed structures are obtained. Further, it is found that the composition (Si/M atomic ratio) of each of the targets of the examples is less dispersed at the center and end portion thereof and exhibits a composition more uniformly distributed than that of the comparative examples.

On the other hand, it is found that when a high pressure is applied from the initial stage of the start of sintering as in depending upon a material) in a vacuum not higher than $1\times10^{-4}$ Torr with a temperature width in each step of 50° C. with a holding time at each step temperature set to 1 hour, so that silicide was synthesized. High purity materials not less than 5N were used as the respective high purity materials.

Next, semi-sintered bodies obtained by synthesizing the suicide were charged into a ball mill the inside of which was lined with high purity Mo together with high purity Mo balls and then mixed for 48 hours with the replacement of the inner atmosphere of the ball mill with an Ar gas. The resultant crushed powders were charged into a high purity Mo vessel having a diameter of 280 mm and the vessel was heated at 1250° C. for 4 hours in a vacuum not higher than $1 \times 10^{-4}$ Torr to subject the powders to a deoxidizing treatment.

Further, resultant semi-sintered bodies (about 280 mm in diameter×40 mm thick) were set to a graphite compacting mold the inside of which was lined with a Ta foil and heated to 1000° C. in a vacuum not higher than $1 \times 10^{-4}$ Torr. Then, the temperature of the semi-sintered bodies was increased stepwise up to a temperature 30° C. lower than the eutectic temperature of each material (final temperature) with a temperature width in each step of 50° C. with a holding time of each temperature set to 1 hour while applying a low pressing pressure of 20 kg/cm² to the semi-sintered bodies. Then, the semi-sintered bodies were hot pressed with a high pressing pressure of 350 kg/cm² in 2 hours after the final temperature was reached, so that sintered bodies each having a diameter of 280 mm and a thickness of 14 mm were made.

The resultant sintered bodies were subjected to grinding, polishing and electric discharging processes and finished to targets each having a diameter of 258 mm and a thickness of 10 mm.

COMPARATIVE EXAMPLES 16–26

As Comparative Examples 16–26, an M powder similar to that of Examples 24–34 was mixed with a Si powder having a maximum grain size of 50 μm and the resultant respective powders were charged into a vacuum furnace having a conventional carbon (C) heater and carbon (C) insulator with a charging depth set to 20 mm and heated to the temperature range from 800 to 1300° C. (different depending upon a material) at a rate of 10° C./minute in a vacuum not higher than $1 \times 10^{-4}$ Torr and semi-sintered bodies were obtained by synthesizing silicide.

Next, the semi-sintered bodies obtained by synthesizing the silicide were set to a graphite compacting mold without being deoxidized and heated to 1000° C. in vacuum. Then, the temperature of the semi-sintered bodies was increased up to a temperature 30° C. lower than the eutectic temperature of each material (final temperature) while applying a pressing pressure of 200 kg/cm² to the semi-sintered bodies. Then, the semi-sintered bodies were held for 2 hours to be hot pressed, so that sintered bodies each having a diameter of 280 mm and a thickness of 14 mm were made and further finished to targets having the same dimension as that of the above examples.

The cross-sectional structures of the respective targets relating to Example 24–34 and Comparative Examples 16–26 were observed under a scanning type electron microscope (SEM) and the number of $MSi_2$ independently existing in a cross section of 0.01 mm², the average grain size of $MSi_2$ and the maximum grain size of Si were measured. Table 6 shows the result of the measurement. Note, the measured values are average values determined by examining a cross section at 20 positions. Further, a grain size is shown by the diameter of a minimum circle circumscribing a grain.

TABLE 6

(To be continued)

| SPECIMEN No. | AVERAGE COMPOSITION OF TARGET | NUMBER OF INDEPENDENT $MSi_2$ (PIECES) | AVERAGE GRAIN SIZE OF $MSi_2$ (μm) | MAXIMUM GRAIN SIZE OF Si (μm) | DISPERSION OF COMPOSITION (Si/M ATOMIC RATIO) |
|---|---|---|---|---|---|
| EXAMPLE 24 | $WSi_{2.8}$ | 9 | 7 | 15 | 2.80 ± 0.01 |
| EXAMPLE 25 | $MoSi_{2.7}$ | 10 | 9 | 13 | 2.70 ± 0.01 |
| EXAMPLE 26 | $TiSi_{2.7}$ | 6 | 7 | 15 | 2.70 ± 0.01 |
| EXAMPLE 27 | $ZrSi_{2.6}$ | 12 | 9 | 12 | 2.60 ± 0.01 |
| EXAMPLE 28 | $HfSi_{2.5}$ | 10 | 7 | 10 | 2.50 ± 0.01 |
| EXAMPLE 29 | $NbSi_{2.7}$ | 8 | 5 | 11 | 2.70 ± 0.01 |
| EXAMPLE 30 | $TaSi_{2.6}$ | 6 | 8 | 9 | 2.60 ± 0.01 |
| EXAMVLE 31 | $VSi_{2.5}$ | 9 | 7 | 13 | 2.50 ± 0.01 |
| EXAMPLE 32 | $CoSi_{2.6}$ | 11 | 9 | 12 | 2.60 ± 0.01 |
| EXAMPLE 33 | $CrSi_{2.7}$ | 7 | 7 | 10 | 2.70 ± 0.01 |
| EXAMPLE 34 | $NiSi_{2.7}$ | 12 | 9 | 13 | 2.70 ± 0.01 |

TABLE 6

| SPECIMEN No. | AVERAGE COMPOSITION OF TARGET | NUMBER OF INDEPENDENT $MSi_2$ (PIECES) | AVERAGE GRAIN SIZE OF $MSi_2$ (μm) | MAXIMUM GRAIN SIZE OF Si (μm) | DISPERSION OF COMPOSITION (Si/M ATOMIC RATIO) |
|---|---|---|---|---|---|
| COMPARATIVE EXAMPLE 16 | $WSi_{2.8}$ | 21 | 20 | 29 | 2.74 ± 0.03 |
| COMPARATIVE EXAMPLE 17 | $MoSi_{2.7}$ | 23 | 21 | 30 | 2.64 ± 0.03 |
| COMPARATIVE EXAMPLE 18 | $TiSi_{2.7}$ | 25 | 26 | 32 | 2.73 ± 0.03 |
| COMPARATIVE EXAMPLE 19 | $ZrSi_{2.6}$ | 20 | 21 | 27 | 2.55 ± 0.03 |
| COMPARATIVE EXAMPLE 20 | $HfSi_{2.5}$ | 33 | 24 | 28 | 2.43 ± 0.03 |
| COMPARATIVE EXAMPLE 21 | $NbSi_{2.7}$ | 27 | 21 | 34 | 2.64 ± 0.03 |

TABLE 6-continued

| SPECIMEN No. | AVERAGE COMPOSITION OF TARGET | NUMBER OF INDEPENDENT $MSi_2$ (PIECES) | AVERAGE GRAIN SIZE OF $MSi_2$ ($\mu$m) | MAXIMUM GRAIN SIZE OF Si ($\mu$m) | DISPERSION OF COMPOSITION (Si/M ATOMIC RATIO) |
|---|---|---|---|---|---|
| COMPARATIVE EXAMPLE 22 | $TaSi_{2.6}$ | 25 | 28 | 22 | 2.54 ± 0.04 |
| COMPARATIVE EXAMPLE 23 | $VSi_{2.5}$ | 23 | 19 | 30 | 2.44 ± 0.03 |
| COMPARATIVE EXAMPLE 24 | $CoSi_{2.6}$ | 29 | 22 | 32 | 2.55 ± 0.03 |
| COMPARATIVE EXAMPLE 25 | $CrSi_{2.7}$ | 27 | 24 | 29 | 2.65 ± 0.04 |
| COMPARATIVE EXAMPLE 26 | $NiSi_{2.7}$ | 25 | 26 | 21 | 2.65 ± 0.03 |

As apparent from the result shown in Table 6, Examples 24–34 have a uniform and fine structure in which the less number of $MSi_2$ independently exist and Si disperses in the gaps of the $MSi_2$, and further $MSi_2$ and Si have a small grain size as compared with Comparative Examples 16–26. Further, in each of the targets of the respective examples, a mixed structure is formed such that fine $MSi_2$ grains shown by white portions are coupled with each other like a chain and fine Si grains shown by black portions disperse among them similarly to the metal structures of the targets of Examples 1 and 6 shown in FIGS. 1 and 2. On the other hand, it is found that in the targets relating to Comparative Examples 16–26, coarse $MSi_2$ grains (gray portions) and Si grains (black portions) grow as well as a ratio of fine $MSi_2$ grains independently existing in a Si phase is increased and thus the targets have a structure in which particles are liable to be generated similarly to the metal structures of the targets relating to Comparative Examples 1 and 4 shown in FIGS. 3 and 4.

Table 6 also shows the result of analysis of a Si/W atomic ratio in a cross section of 1 mm² of the mixed structure of each target obtained by a surface analyzing instrument (X-ray microanalyzer: EPMA). It is found from the result of analysis that the examples have compositions nearer to an intended composition as compared with the comparative examples and further have uniform compositions.

Table 7 shows the result of measurement of the densities of the respective targets and the result of analysis of oxygen, carbon, iron and aluminium.

TABLE 7

| SPECIMEN No. | AVERAGE COMPOSITION OF TARGET | DISPERSION OF DENSITY RATIO | AMOUNT OF IMPURITY (ppm) | | | | NUMBER OF PARTICLES (PIECES) |
|---|---|---|---|---|---|---|---|
| | | | $O_2$ | C | Fe | Al | |
| EXAMPLE 24 | $WSi_{2.8}$ | 99.8 ± 0.1 | 135 | 30 | 0.4 | 0.1 | 8 |
| EXAMPLE 25 | $MoSi_{2.7}$ | 99.8 ± 0.1 | 141 | 25 | 0.5 | 0.3 | 9 |
| EXAMPLE 26 | $TiSi_{2.7}$ | 99.7 ± 0.1 | 185 | 33 | 0.6 | 0.2 | 15 |
| EXAMPLE 27 | $ZrSi_{2.6}$ | 99.8 ± 0.1 | 122 | 30 | 0.5 | 0.3 | 16 |
| EXAMPLE 28 | $HfSi_{2.5}$ | 99.8 ± 0.1 | 179 | 34 | 0.7 | 0.3 | 13 |
| EXAMPLE 29 | $NbSi_{2.7}$ | 99.8 ± 0.1 | 165 | 25 | 0.5 | 0.2 | 17 |
| EXAMPLE 30 | $TaSi_{2.6}$ | 99.7 ± 0.2 | 143 | 37 | 0.6 | 0.3 | 9 |
| EXAMPLE 31 | $VSi_{2.5}$ | 99.7 ± 0.1 | 178 | 35 | 0.7 | 0.3 | 17 |
| EXAMPLE 32 | $CoSi_{2.6}$ | 99.8 ± 0.1 | 188 | 38 | 0.6 | 0.2 | 18 |
| EXAMPLE 33 | $CrSi_{2.7}$ | 99.7 ± 0.1 | 155 | 31 | 0.8 | 0.4 | 14 |
| EXAMPLE 34 | $NiSi_{2.7}$ | 99.7 ± 0.2 | 187 | 40 | 0.8 | 0.3 | 20 |
| COMPARATIVE EXAMPLE 16 | $WSi_{2.8}$ | 99.1 ± 0.3 | 954 | 117 | 2.1 | 2.2 | 257 |
| COMPARATIVE EXAMPLE 17 | $MoSi_{2.7}$ | 99.0 ± 0.3 | 1180 | 123 | 3.1 | 2.3 | 277 |
| COMPARATIVE EXAMPLE 18 | $TiSi_{2.7}$ | 98.5 ± 0.4 | 3475 | 188 | 4.5 | 3.3 | 327 |
| COMPARATIVE EXAMPLE 19 | $ZrSi_{2.6}$ | 98.6 ± 0.3 | 1946 | 170 | 3.8 | 2.2 | 244 |
| COMPARATIVE EXAMPLE 20 | $HfSi_{2.5}$ | 98.8 ± 0.3 | 1737 | 152 | 3.2 | 3.1 | 217 |
| COMPARATIVE EXAMPLE 21 | $NbSi_{2.7}$ | 98.7 ± 0.4 | 2254 | 162 | 4.0 | 2.9 | 289 |
| COMPARATIVE EXAMPLE 22 | $TaSi_{2.6}$ | 98.5 ± 0.4 | 2790 | 189 | 4.2 | 3.1 | 336 |
| COMPARATIVE EXAMPLE 23 | $VSi_{2.5}$ | 98.6 ± 0.3 | 2774 | 175 | 3.9 | 2.7 | 297 |
| COMPARATIVE EXAMPLE 24 | $CoSi_{2.6}$ | 99.0 ± 0.3 | 1995 | 147 | 3.5 | 2.5 | 207 |
| COMPARATIVE EXAMPLE 25 | $CrSi_{2.7}$ | 98.7 ± 0.3 | 2065 | 155 | 3.7 | 2.6 | 268 |
| COMPARATIVE EXAMPLE 26 | $NiSi_{2.7}$ | 98.4 ± 0.4 | 3358 | 189 | 4.5 | 3.9 | 357 |

As is apparent from the result shown in Table 7, it was found that the targets relating to Examples 24–34 have a density ratio not less than 99.5% and a very small content of impurities as compared with the targets relating to Comparative Examples 16–26.

The respective targets relating to Examples 24–34 and Comparative Examples 16–26 were set to a magnetron sputtering apparatus and sputtered under the condition of an argon pressure of $2.3 \times 10^{-3}$ Torr and a silicide film was deposited on a 6 inch Si wafer to about 3000Å thick. The same operation was repeated 10 times and an amount of mixed particles having a particle size not less than 0.2 $\mu$m was measured. Table 7 also shows the result of the measurement. As also apparent from the result shown in Table 7, according to the targets relating to Examples 24–34, the number of particles mixed on the 6 inch wafer is not greater than 20 and very small, whereas according to Comparative Examples 16–26, it is found that a lot of particles which are about 10 times those of Examples 24–34 are generated.

Industrial Applicability:

As described above, the refractory metal silicide targets according to the present invention have a high purity, high density fine mixed structure composed of refractory metal silicide grains and Si grains in which Si grains uniformly disperse and, the compositions in the targets are uniformly arranged. Consequently, the employment of the targets reduces particles produced in sputtering, the change of a film resistance on a wafer surface and the impurities and the like in the film of the wafer face and can improve yield and reliability when semiconductors are manufactured.

What is claimed is:

1. A refractory metal silicide target, comprising a fine mixed structure composed of $MSi_2$ grains, wherein M is at least one refractory metal selected from W, Mo, Ti, Ta, Zr, Hf, Nb, V, Co, Cr, Ni; and Si grains, wherein the number of $MSi_2$ grains independently existing in a cross section of 0.01 $mm^2$ of the mixed structure is not greater than 15, the $MSi_2$ grains have an average grain size not greater than 10 $\mu m$, whereas free Si grains existing in gaps of the $MSi_2$ grains have a maximum grain size not greater than 20 $\mu m$.

2. A refractory metal silicide target according to claim 1, wherein when the average value of a Si/M atomic ratio in the entire sputtering target is assumed to be X, the dispersion of the Si/M atomic ratio in an arbitrary cross section of 1 $mm^2$ in the mixed structure is in a range of X±0.02.

3. A refractory metal silicide target according to claim 1, wherein a density ratio is not less than 99.5% over the entire target.

4. A refractory metal silicide target according to claim 1, wherein an oxygen content is not greater than 200 ppm and a carbon content is not greater than 50 ppm.

5. A refractory metal silicide target according to claim 1, wherein an iron content and an aluminium content are not greater than 1 ppm, respectively.

* * * * *